US011929353B2

(12) United States Patent
Hisanaga et al.

(10) Patent No.: US 11,929,353 B2
(45) Date of Patent: Mar. 12, 2024

(54) WHITE LIGHT EMITTING DEVICE

(71) Applicant: NUVOTON TECHNOLOGY CORPORATION JAPAN, Kyoto (JP)

(72) Inventors: Hidesato Hisanaga, Toyama (JP); Tetsuya Kamada, Hyogo (JP); Shigeo Hayashi, Kyoto (JP); Takashi Kuwaharada, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 717 days.

(21) Appl. No.: 17/124,246

(22) Filed: Dec. 16, 2020

(65) Prior Publication Data
US 2021/0104501 A1 Apr. 8, 2021

Related U.S. Application Data

(63) Continuation of application No. PCT/JP2019/021231, filed on May 29, 2019.

(30) Foreign Application Priority Data

Jun. 21, 2018 (JP) .................................. 2018-118277

(51) Int. Cl.
H01L 25/075 (2006.01)
F21K 9/00 (2016.01)
(Continued)

(52) U.S. Cl.
CPC ............ H01L 25/0753 (2013.01); F21K 9/00 (2013.01); H01L 33/486 (2013.01);
(Continued)

(58) Field of Classification Search
CPC ........ H05B 45/22; H05B 45/24; H05B 45/28; G02B 6/0065; H01L 2924/0002
See application file for complete search history.

(56) References Cited

U.S. PATENT DOCUMENTS

2007/0284564 A1 12/2007 Biwa et al.
2010/0320479 A1* 12/2010 Minato .................. H01L 33/62
257/E33.072
(Continued)

FOREIGN PATENT DOCUMENTS

JP 2007-110090 A 4/2007
JP 2011-086580 A 4/2011
(Continued)

OTHER PUBLICATIONS

International Search Report and Written Opinion dated Aug. 27, 2019 in International Application No. PCT/JP2019/021231; with partial English translation.

Primary Examiner — Eric T Eide
(74) Attorney, Agent, or Firm — Rimon P.C.

(57) ABSTRACT

A white light emitting device includes: first light-emitting units to which a first current is applied; and second light-emitting units to which a second current which is different from the first current is applied. When the first current is applied to the first light-emitting units and the second current is applied to the second light-emitting units, an average emission chromaticity of the first light-emitting units and an average emission chromaticity of the second light-emitting units are identical colors. When the same current is applied to both the first light-emitting units and the second light-emitting units, the average emission chromaticity of the first light-emitting units and the average emission chromaticity of the second light-emitting units are non-identical colors.

13 Claims, 10 Drawing Sheets

(51) Int. Cl.
*H01L 33/48* (2010.01)
*H01L 33/50* (2010.01)
*H01L 33/60* (2010.01)
*H01L 33/62* (2010.01)

(52) U.S. Cl.
CPC ............ *H01L 33/505* (2013.01); *H01L 33/60* (2013.01); *H01L 33/62* (2013.01)

(56) References Cited

U.S. PATENT DOCUMENTS

| | | | |
|---|---|---|---|
| 2011/0121732 A1* | 5/2011 | Tsutsumi | F21S 41/663 |
| | | | 315/77 |
| 2012/0104452 A1* | 5/2012 | Miyoshi | H01L 33/54 |
| | | | 257/E33.059 |
| 2014/0340890 A1* | 11/2014 | Hata | F21V 29/74 |
| | | | 438/27 |
| 2016/0372515 A1 | 12/2016 | Miyoshi et al. | |

FOREIGN PATENT DOCUMENTS

| | | |
|---|---|---|
| JP | 2013-135073 A | 7/2013 |
| JP | 2017-011259 A | 1/2017 |
| JP | 2017-193257 A | 10/2017 |

\* cited by examiner

WHITE LIGHT EMITTING DEVICE

CROSS REFERENCE TO RELATED APPLICATIONS

This application is a U.S. continuation application of PCT International Patent Application Number PCT/JP2019/021231 filed on May 29, 2019, claiming the benefit of priority of Japanese Patent Application Number 2018-118277 filed on Jun. 21, 2018, the entire contents of which are hereby incorporated by reference.

BACKGROUND

1. Technical Field

The present disclosure relates to a white light emitting device.

2. Description of the Related Art

In recent years, semiconductor light-emitting elements, such as light-emitting diodes and laser diodes, have been used as light sources for headlamps of automobiles, outdoor and indoor lighting, and the like. In particular, a light distribution pattern of a light-emitting device of a headlamp for an automobile is required to include an area called a hot zone which is brighter than the surrounding area. Hence, in a light-emitting device of a headlamp for an automobile, light-emitting units including semiconductor light-emitting elements are arranged in a matrix, and light-emitting units around the center are illuminated brightly.

Patent Literature (PTL) 1, Japanese Unexamined Patent Application Publication No. 2017-11259, discloses a light-emitting diode module used for a headlamp of an automobile. The light-emitting diode module disclosed in PTL 1 includes, on a substrate, a plurality of first light-emitting elements and a plurality of second light-emitting elements each having a light-emitting area smaller than the first light-emitting elements. Each second light-emitting element is arranged between two of the first light-emitting elements, and is connected to the two first light-emitting elements in series. Such a series connection configuration is adopted to achieve a light source including a hot zone, that is, a light source in which the same current is applied to each element and the current density in the second light-emitting elements in the central portion is higher than the left and right portions to provide high luminance light emission.

SUMMARY

In such a light source including a hot zone in the central portion, the light-emitting elements arranged in the central portion are required to have high current density. However, since the emission chromaticity of an LED light-emitting unit has a current dependency and a current density dependency, the chromaticity on the projection surface differs between the central portion and the surrounding portion.

An object of the present disclosure is to provide a white light emitting device which includes a plurality of light-emitting units and in which the emission chromaticities of the light-emitting units can be made identical colors in the case where the light-emitting units to which different currents are applied coexist.

One aspect of a white light emitting device according to the present disclosure is a white light emitting device which includes: a first light-emitting unit group including a plurality of first light-emitting units to which a first current is applied; a second light-emitting unit group including a plurality of second light-emitting units to which a second current is applied, the second current being different from the first current; and a mounting substrate on which the first light-emitting unit group and the second light-emitting unit group are mounted. Each of the plurality of first light-emitting units includes a first light-emitting diode (LED) chip and a first phosphor member, and is arranged adjacent to at least another one of the plurality of first light-emitting units, each of the plurality of second light-emitting units includes a second LED chip and a second phosphor member, and is arranged adjacent to at least another one of the plurality of second light-emitting units, when the first current is applied to the plurality of first light-emitting units and the second current is applied to the plurality of second light-emitting units, an average emission chromaticity of the plurality of first light-emitting units and an average emission chromaticity of the plurality of second light-emitting units are identical colors, and when a same current is applied to both the plurality of first light-emitting units and the plurality of second light-emitting units, the average emission chromaticity of the plurality of first light-emitting units and the average emission chromaticity of the plurality of second light-emitting units are non-identical colors.

As described above, in the case where the first light-emitting units and the second light-emitting units to which a current different from the current applied to the first light-emitting units is applied coexist, the emission chromaticities of the first light-emitting units and the second light-emitting units can be made identical colors. Accordingly, for example, by arranging the first light-emitting unit group in the central portion of the light distribution pattern, a white light emitting device can be achieved which has a high luminance in the central portion (that is, includes a hot zone), and in which the central portion and the surrounding portion have emission chromaticities which are identical colors.

In one aspect of the white light emitting device according to the present disclosure, it may be that the first light-emitting unit group and the second light-emitting unit group are arranged adjacent to each other on the mounting substrate.

As described above, the first light-emitting unit group and the second light-emitting unit group are arranged adjacent to each other to form one light distribution pattern. Accordingly, it is possible to achieve a white light emitting device in which one light distribution pattern has regions with different luminance and the emission chromaticity does not vary between the regions.

In one aspect of the white light emitting device according to the present disclosure, it may be that when the average emission chromaticity of the plurality of first light-emitting units at a time of application of the first current to the plurality of first light-emitting units is represented by CIE coordinates (Cx11, Cy11), the average emission chromaticity of the plurality of second light-emitting units at a time of application of the first current to the plurality of second light-emitting units is represented by CIE coordinates (Cx21, Cy21), and the average emission chromaticity of the plurality of second light-emitting units at a time of application of the second current to the plurality of second light-emitting units is represented by CIE coordinates (Cx22, Cy22), the identical colors are defined to satisfy relations of |Cx11−Cx22|<0.0055 and |Cy11−Cy22|<0.0074, and the non-identical colors are defined to satisfy one of relations of |Cx11−Cx21|≥0.0055 and |Cy11−Cy21|≥0.0074.

In one aspect of the white light emitting device according to the present disclosure, it may be that when n is a total number of the plurality of first light-emitting units and m is a total number of the plurality of second light-emitting units, an emission chromaticity of each of the plurality of first light-emitting units at the time of application of the first current to the plurality of first light-emitting units is represented by CIE coordinates (Cx11i, Cy11i) (1≤i≤n), and an emission chromaticity of each of the plurality of second light-emitting units at the time of application of the first current to the plurality of second light-emitting units is represented by CIE coordinates (Cx21i, Cy21i) (1≤i≤m), all of the CIE coordinates (Cx11i, Cy11i) are inside a region represented by |Cx11−Cx11i|<0.0055 and |Cy11−Cy11i|<0.0074, and all of the CIE coordinates (Cx21i, Cy21i) are inside a region represented by |Cx21−Cx21i|<0.0055 and |Cy21−Cy21i|<0.0074.

In one aspect of the white light emitting device according to the present disclosure, it may be that when the average emission chromaticity of the plurality of first light-emitting units at a time of application of the first current to the plurality of first light-emitting units is represented by CIE coordinates (Cx11, Cy11), the average emission chromaticity of the plurality of second light-emitting units at a time of application of the first current to the plurality of second light-emitting units is represented by CIE coordinates (Cx21, Cy21), and the average emission chromaticity of the plurality of second light-emitting units at a time of application of the second current to the plurality of second light-emitting units is represented by CIE coordinates (Cx22, Cy22), the identical colors are defined to satisfy that the CIE coordinates (Cx22, Cy22) is inside a 3-step MacAdam ellipse centered around the CIE coordinates (Cx11, Cy11), and the non-identical colors are defined to satisfy that the CIE coordinates (Cx21, Cy21) are either on or outside the 3-step MacAdam ellipse centered around the CIE coordinates (Cx11, Cy11).

In one aspect of the white light emitting device according to the present disclosure, it may be that when an emission chromaticity of each of the plurality of first light-emitting units at the time of application of the first current to the plurality of first light-emitting units is represented by CIE coordinates (Cx11i, Cy11i) (1≤i≤n), and an emission chromaticity of each of the plurality of second light-emitting units at the time of application of the first current to the plurality of second light-emitting units is represented by CIE coordinates (Cx21i, Cy21i) (1≤i≤m), all of the CIE coordinates (Cx11i, Cy11i) are inside the 3-step MacAdam ellipse centered around the CIE coordinates (Cx11, Cy11), and all of the CIE coordinates (Cx21i, Cy21i) are inside a 3-step MacAdam ellipse centered around the CIE coordinates (Cx21, Cy21).

In one aspect of the white light emitting device according to the present disclosure, it may be that when an average value of chromaticities of all of the first phosphor members included in the first light-emitting unit group is represented by CIE coordinates (CxP1, CyP1), and an average value of chromaticities of all of the second phosphor members included in the second light-emitting unit group is represented by CIE coordinates (CxP2, CyP2), relations of 0.0066≤|CxP1−CxP2| and 0.0120≤|CyP1−CyP2| are satisfied.

In one aspect of the white light emitting device according to the present disclosure, it may be that the first phosphor members and the second phosphor members are different from each other in at least one of a phosphor species, a phosphor composition, an activated element species in a phosphor, or a concentration of the activated element species in the phosphor.

In one aspect of the white light emitting device according to the present disclosure, it may be that when light with a wavelength equal to a wavelength of one of the first LED chip and the second LED chip is emitted to the first phosphor member and the second phosphor member, P1 is an average value of emission intensities of all of the first phosphor members included in the first light-emitting unit group, and P2 is an average value of emission intensities of all of the second phosphor members included in the second light-emitting unit group, a relation of 0.954≤P2/P1≤0.976 is satisfied.

In one aspect of the white light emitting device according to the present disclosure, it may be that the first phosphor members include phosphor particles and the second phosphor members include phosphor particles, when VP1 is an average value of volumes of all of the first phosphor members included in the first light-emitting unit group, and D1 is an average value of volume concentrations of the phosphor particles of all of the first phosphor members included in the first light-emitting unit group, and VP2 is an average value of volumes of all of the second phosphor members included in the second light-emitting unit group, and D2 is an average value of volume concentrations of the phosphor particles of all of the second phosphor members included in the second light-emitting unit group, relations of 0.954≤D2/D1≤0.976 and VP1=VP2 are satisfied.

In one aspect of the white light emitting device according to the present disclosure, it may be that wherein the first phosphor members include phosphor particles and the second phosphor members include phosphor particles, when VP1 is an average value of volumes of all of the first phosphor members included in the first light-emitting unit group, and D1 is an average value of volume concentrations of the phosphor particles of all of the first phosphor members included in the first light-emitting unit group, and VP2 is an average value of volumes of all of the second phosphor members included in the second light-emitting unit group, and D2 is an average value of volume concentrations of the phosphor particles of all of the second phosphor members included in the second light-emitting unit group, relations of 0.954≤VP2/VP1≤0.976 and D1=D2 are satisfied.

The present disclosure provides a white light emitting device which includes a plurality of light-emitting units and which is capable of having a uniform emission chromaticity among the light-emitting units in the case where the light-emitting units to which different currents are applied coexist.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Figure 1:
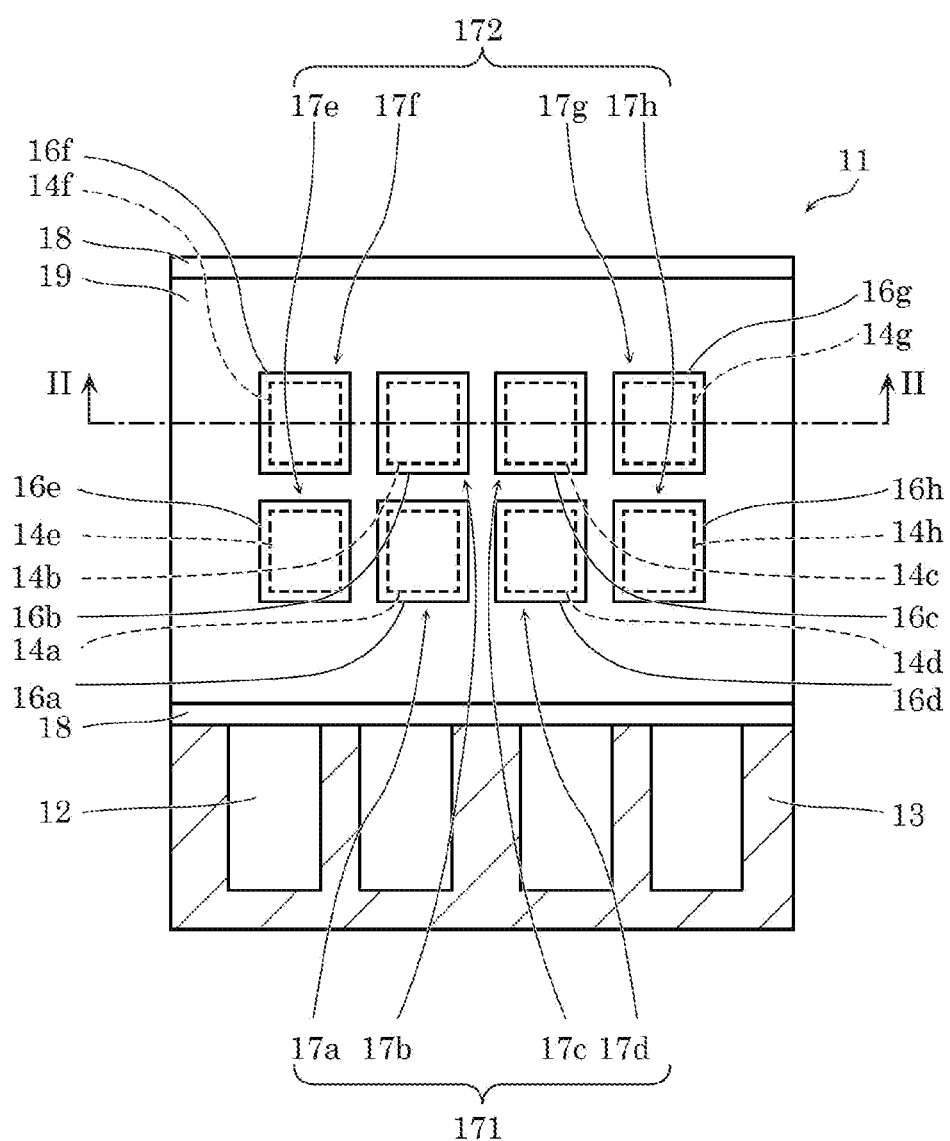
FIG. 1 is a schematic top view of an example of a configuration of a white light emitting device according to Embodiment 1.

Hereinafter, embodiments of the present disclosure will be described with reference to the drawings. Each of the embodiments described below shows a specific example of the present disclosure. Therefore, the numerical values, shapes, materials, structural elements, arrangement positions and connection forms of the structural elements, and the steps and the order of the steps, which are shown in the following embodiments are merely examples and are not intended to limit the present disclosure. Accordingly, among the structural elements in the following embodiments, structural elements that are not described in the independent claims that indicate the highest concept of the present disclosure are described as arbitrary structural elements.

Note that the drawings are represented schematically and are not necessarily precise illustrations. As such, the scaling, etc., depicted in the drawings is not necessarily accurate. Additionally, like reference signs indicate like elements in the drawings, and overlapping descriptions thereof are omitted or simplified.

Embodiment 1

[1-1. Basic Configuration]

A basic configuration of a white light emitting device according to Embodiment 1 will be described with reference to FIG. 1 and FIG. 2.

Figure 2:
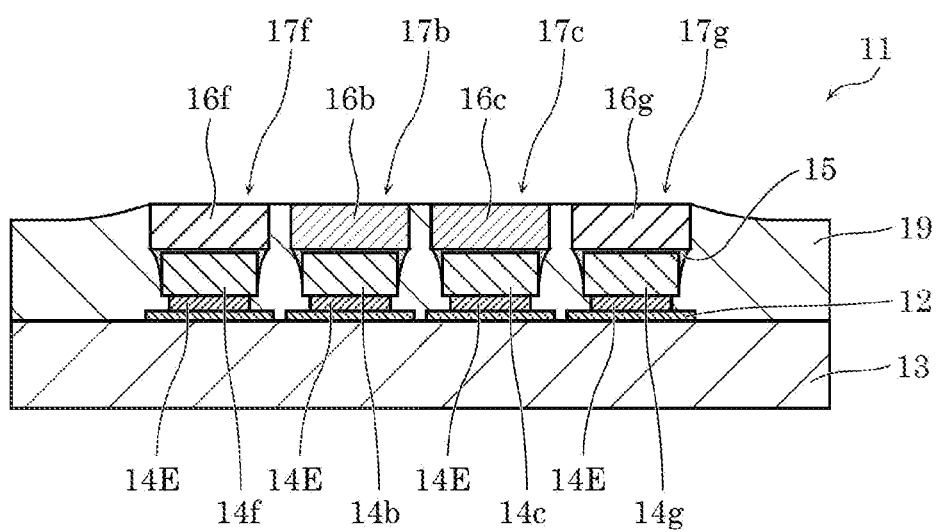
FIG. 2 is a cross-sectional view of an example of a configuration of the white light emitting device according to Embodiment 1.

FIG. 1 and FIG. 2 are respectively a schematic top view and a cross-sectional view of an example of a configuration of white light emitting device 11 according to the present embodiment. FIG. 2 illustrates a cross section taken along line II-II of white light emitting device 11 in FIG. 1.

White light emitting device 11 is a device which emits white light. As illustrated in FIG. 1, white light emitting device 11 includes first light-emitting unit group 171, second light-emitting unit group 172, and mounting substrate 13. White light emitting device 11 further includes frames 18 and reflective resin 19.

First light-emitting unit group 171 includes a plurality of first light-emitting units 17a to 17d to which a first current is applied. Each of first light-emitting units 17a to 17d includes a first light-emitting diode (LED) chip and a first phosphor member. As illustrated in FIG. 1, first light-emitting units 17a to 17d include first LED chips 14a to 14d and first phosphor members 16a to 16d, respectively. Each of first light-emitting units 17a to 17d is arranged adjacent to at least another one of first light-emitting units 17a to 17d.

Second light-emitting unit group 172 includes a plurality of second light-emitting units 17e to 17h to which a second current is applied. Each of second light-emitting units 17e to 17h includes a second LED chip and a second phosphor member. As illustrated in FIG. 1, second light-emitting units 17e to 17h include second LED chips 14e to 14h and second phosphor members 16e to 16h, respectively. Each of second light-emitting units 17e to 17h is arranged adjacent to at least another one of second light-emitting units 17e to 17h.

In the present embodiment, first light-emitting unit group 171 and second light-emitting unit group 172 are arranged adjacent to each other on a mounting substrate. First light-emitting unit group 171 is arranged in the central portion on mounting substrate 13. Second light-emitting unit group 172 is separated into two, and is arranged outside first light-emitting unit group 171. Accordingly, white light emitting device 11 includes first light-emitting units 17a to 17d and second light-emitting units 17e to 17h arranged in a matrix as illustrated in FIG. 1. Note that the arrangement of second light-emitting unit group 172 is not limited to the example illustrated in FIG. 1. For example, second light-emitting unit group 172 may surround first light-emitting unit group 171. Second light-emitting unit group 172 may also be arranged adjacent to only one side of first light-emitting unit group 171.

Mounting substrate 13 is a substrate on which first light-emitting unit group 171 and second light-emitting unit group 172 are mounted. In the present embodiment, mounting substrate 13 includes two sets of wiring electrodes 12. A current is applied to first LED chips 14a to 14d of first light-emitting units 17a to 17d via one set of wiring electrodes 12 among the two sets of wiring electrodes 12. A current is applied to second LED chips 14e to 14h of second light-emitting units 17e to 17h via the other set of wiring electrodes 12.

As illustrated in FIG. 2, wiring electrode 12 is connected to element electrode 14E of each LED chip. Moreover, a first phosphor member and a second phosphor member are respectively fixed to the light emitting surfaces of the first LED chip and the second LED chip by transparent adhesive 15.

Reflective resin 19 is a resin disposed on mounting substrate 13, in a region including a region in which the first light-emitting units and the second light-emitting units are disposed. In the present embodiment, reflective resin 19 is arranged between two frames 18 on mounting substrate 13. Reflective resin 19 is not particularly limited as long as reflective resin 19 reflects light from each light-emitting unit. In the present embodiment, reflective resin 19 is made of a silicone resin in which light reflective particles, such as titanium oxide, are mixed.

Frames 18 are members disposed outside the region where first light-emitting unit group 171 and second light-emitting unit group 172 are arranged. Frames 18 are members for preventing reflective resin 19 from leaking onto unnecessary region on mounting substrate 13 and to outside mounting substrate 13 when reflective resin 19 is disposed. Frames 18 are made of, for example, a silicone resin in which light reflective particles, such as titanium oxide, are mixed.

First LED chips 14a to 14d and second LED chips 14e to 14h are light sources which emit light to first phosphor members 16a to 16d and second phosphor members 16e to 16h, respectively. In the present embodiment, the LED chips used here have emission chromaticities which can be considered as the same and emission intensities which can be considered as the same. Here, the term "the LED chips have the same emission chromaticity and the same emission intensity" is defined to mean that the CIE coordinates representing the emission chromaticity of the combined light obtained when the output light of each LED chip is emitted to a corresponding phosphor member are inside the 3-step MacAdam ellipse centered around the CIE coordinates representing the average emission chromaticity (the average value of the emission chromaticities) of all of the LED chips.

Each of first phosphor members 16a to 16d and each of second phosphor members 16e to 16h converts the wavelength of light from a corresponding LED chip. For first phosphor members 16a to 16d included in first light-emitting unit group 171, phosphor members are used which have emission chromaticities which can be considered as the same and emission intensities which can be considered as the same.

Here, the term "the phosphor members have the same emission chromaticity and the same emission intensity" is defined to mean that the CIE coordinates representing the emission chromaticity of the combined light obtained when the output light of each LED chip is emitted to a corresponding phosphor member are inside the 3-step MacAdam ellipse centered around the CIE coordinates representing the average emission chromaticity of all of the phosphor members.

In a similar manner, for second phosphor members 16e to 16h included in second light-emitting unit group 172, too, phosphor members are used which have emission chromaticities which can be considered as the same and emission intensities which can be considered as the same. In the present embodiment, second phosphor members 16e to 16h included in second light-emitting unit group 172 and first phosphor members 16a to 16d included in first light-emitting unit group 171 are different in at least one of the phosphor species, phosphor composition (component ratio), the activated element species in the phosphor, or the concentration of the activated element species in the phosphor.

In white light emitting device 11 according to the present embodiment, when a first current is applied to first light-emitting units 17a to 17d and a second current is applied to second light-emitting units 17e to 17h, the average emission chromaticity of first light-emitting unit 17a to 17d and the average emission chromaticity of second light-emitting units 17e to 17h are identical colors. Here, when the average emission chromaticity of first light-emitting units 17a to 17d at the time of application of the first current to first light-emitting units 17a to 17d is represented by CIE coordinates (Cx11, Cy11), and the average emission chromaticity of second light-emitting units 17e to 17h at the time of application of the second current to second light-emitting units 17e to 17h is represented by CIE coordinates (Cx22, Cy22), the identical colors are defined to satisfy that the CIE coordinates (Cx22, Cy22) are inside the 3-step MacAdam ellipse centered around the CIE coordinates (Cx11, Cy11). In this case, the CIE coordinates representing the average emission chromaticity of second light-emitting unit group 172 are inside the 3-step MacAdam ellipse centered around the CIE coordinates representing the average emission chromaticity of first light-emitting unit group 171. The average emission intensity of first light-emitting unit group 171 is higher than the average emission intensity of second light-emitting unit group 172.

In white light emitting device 11 according to the present embodiment, when the same current is applied to both first light-emitting units 17a to 17d and second light-emitting units 17e to 17h, the average emission intensity of first light-emitting units 17a to 17d and the average emission intensity of second light-emitting units 17e to 17h are the same. In contrast, the average emission chromaticity of first light-emitting units 17a to 17d and the average emission chromaticity of second light-emitting units 17e to 17h are non-identical colors. In this case, the average emission chromaticity of second light-emitting unit group 172 is either on or outside the 3-step MacAdam ellipse centered around the average emission chromaticity of first light-emitting unit group 171. In other words, when the average emission chromaticity of first light-emitting units 17a to 17d at the time of application of the first current to first light-emitting units 17a to 17d is represented by the CIE coordinates (Cx11, Cy11), and the average emission chromaticity of second light-emitting units 17e to 17h at the time of application of the first current to second light-emitting units 17e to 17h is represented by the CIE coordinates (Cx21, Cy21), the non-identical colors are defined to satisfy that the CIE coordinates (Cx21, Cy21) are either on or outside the 3-step MacAdam ellipse centered around the CIE coordinates (Cx11, Cy11).

As described above, when the first light-emitting units and the second light-emitting units to which a current different from the current applied to the first light-emitting units is applied coexist, the emission chromaticities of the first and second light-emitting units can be made identical colors. Accordingly, for example, by arranging the first light-emitting unit group in the central portion of the light distribution pattern, a white light emitting device can be achieved in which the luminance in the central portion is high (that is, a hot zone is included), and the emission chromaticities of the central portion and the surrounding portion are identical colors.

The values of the first current and the second current are not particularly limited. In the present embodiment, a first rated current and a second rated current are respectively used as the first current and the second current. The first rated current is a rated current for first light-emitting units 17a to 17d and the second rated current is a rated current for second light-emitting units 17e to 17h in white light emitting device 11.

[1-2. Detailed Configuration]

Next, a detailed configuration of white light emitting device 11 according to the present embodiment will be described.

In the present embodiment, the case will be described where the LED chips are used which have the same chip size, the same semiconductor stack structure, the same rated current and the same rated wavelength (or rated chromaticity), and two species of plate-shaped phosphor members are used which have chromaticities that are non-identical colors.

For each LED chip, a blue LED is used which includes, on an n-type GaN substrate, an n-type GaN-based layer, an InGaN active layer, and a p-type GaN-based layer. Each LED chip is flip-chip mounted on mounting substrate 13. On the upper end portions of the LED chips in FIG. 2 (the emission surface of the LED chip), plate-shaped yellow first phosphor members 16a to 16d or second phosphor members 16e to 16h are disposed. In the present embodiment, part of the light emitted from the LED chips is respectively wavelength-converted by first phosphor members 16a to 16d or second phosphor members 16e to 16h, so that the wavelength-converted light is emitted. The light emitted from each LED chip and the wavelength-converted light are combined as described above, so that white light is obtained.

Each LED chip is manufactured with a goal to have a dominant wavelength of 445 nm. Due to manufacturing variations, the dominant wavelength of each LED chip has a distribution centered around 445 nm. The CIE coordinates (Cx1, Cy1) of the average value of the emission chromaticities corresponding to the wavelength are (0.1600, 0.0400), and the difference (ΔCx, ΔCy) between the maximum chromaticity value and the minimum chromaticity value is less than (0.0030, 0.0020) in the CIE coordinate system. This difference corresponds to less than 2 nm when converted into the wavelength.

Here, the range of the distribution of the emission chromaticities of the LED chips may be such that the combined light obtained when blue light is emitted to a corresponding phosphor member looks identical colors. Specifically, the respective LED chips can be considered as the same LED chips, when the difference between the CIE coordinates representing the emission chromaticity of each LED chip and the CIE coordinates representing the average chromaticity is less than (0.0150, 0.0100), from a calculation based on the assumption that 63.3% of the LED light is wavelength-converted by a combination of an LED chip and a phosphor member having a chromaticity of (0.4347, 0.5416) in the CIE coordinate system. Here, from the empirical correlation between the wavelength and the chromaticity of an InGaN-based LED chip with a wavelength close to 445 nm, it is known that the CIE coordinates representing the chromaticity changes by (−0.0015, 0.0010) in response to a change of the wavelength by 1 nm. Hence, the respective LED chips can be considered as the same LED chips, when converted into the emission wavelength and the error of the emission wavelength of each LED is less than ±10 nm.

The range of the variations in the emission intensity of the LEDs may be such that the white combined light obtained when blue excitation light is emitted to one phosphor member looks identical colors. Specifically, the LED chips can be considered as the same LED chips, when the difference between the emission intensity of each LED chip and the average intensity is less than ±4.2% from the calculation based on the assumption that 63.3% of the LED light is wavelength-converted by a combination with a phosphor member with a chromaticity of (0.4240, 0.5220).

Each of first phosphor members 16a to 16d and each of second phosphor members 16e to 16h is a plate-shaped wavelength conversion member in which a wavelength conversion material (phosphor) for converting the wavelength of light from a corresponding LED chip is dispersed in a material such as resin, ceramics, or glass. As the wavelength conversion material, for example, a known wavelength conversion material, such as YAG, CASN, SiAlON, or LSN, can be used. The surface of each phosphor member on the LED chip side is a surface adhered to the LED chip, and the surface of the phosphor member on the opposite side is a light emitting surface of white light emitting device 11.

In the present embodiment, each phosphor member is a composite in which YAG:Ce-based particles and alumina ceramic particles are evenly mixed, and has a plate shape with a thickness of 100 μm in which the occupancy of the YAG particles as the phosphor is 20% by volume. For first phosphor members 16a to 16d, phosphor members are used in which the CIE coordinates (Cx, Cy) of the average emission chromaticity are (0.4347, 0.5416), and the variations (ΔCx, ΔCy) are less than (±0.0040, ±0.0040), and an error of the emission intensity relative to the average emission intensity is less than ±2.0%. For second phosphor members 16e to 16h, phosphor members are used which have phosphor compositions different from first phosphor members 16a to 16d, and in which the CIE coordinates (Cx, Cy) of the average emission chromaticity are (0.4240, 0.5220), the variations (ΔCx, ΔCy) are less than (±0.0040, ±0.0040), and an error of the emission intensity relative to the average emission intensity is less than ±2.0%. Hereinafter, the chromaticity is represented by using the CIE coordinate system with array values of (Cx, Cy).

Here, the range of the emission chromaticity distribution of first phosphor members 16a to 16d may be such that the combined light obtained when blue light of a corresponding LED chip is emitted looks identical colors. Specifically, the phosphor members can be considered as the same phosphor members when the difference between the chromaticity of each phosphor member and the average chromaticity is less than (±0.0066, ±0.0120) in the CIE coordinate system from the calculation based on the assumption that 63.3% of LED light is wavelength-converted by a combination with an LED chip having a chromaticity of (0.1600, 0.0400) in the CIE coordinate system. The same also applies to second phosphor members 16e to 16h.

Moreover, the range of the distribution of the emission intensity of yellow light emitted from first phosphor members 16a to 16d may be such that the combined white light obtained when an excitation light beam is emitted looks identical colors. Specifically, the phosphor members can be considered as the same phosphor members when the difference between the emission intensity of each phosphor member and the average emission intensity is less than ±2.4% from the calculation based on the assumption that 63.3% of LED light is wavelength-converted by a combination with a phosphor member having a chromaticity of (0.4240, 0.5220). The same also applies to second phosphor members 16e to 16h.

First LED chips 14a to 14d and first phosphor members 16a to 16d are respectively adhered to each other by transparent adhesive 15 to be used as first light-emitting units 17a to 17d. Second LED chips 14e to 14h and second phosphor members 16e to 16h are respectively adhered to each other by transparent adhesive 15, to be used as second light-emitting units 17e to 17h.

Figure 3:
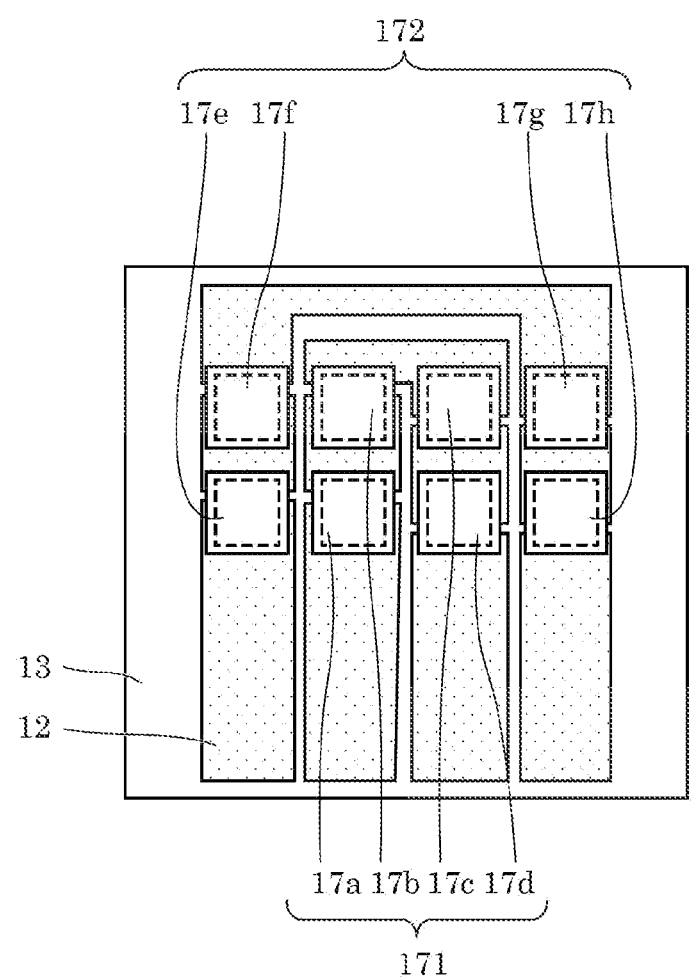
FIG. 3 is a top view of shapes of wiring electrodes according to Embodiment 1.

Next, wiring electrodes 12 on mounting substrate 13 will be described with reference to FIG. 3. FIG. 3 is atop view of shapes of wiring electrodes 12 according to the present embodiment. FIG. 3 illustrates the upper surface of mounting substrate 13. FIG. 3 also illustrates light-emitting units together with wiring electrodes 12.

As illustrated in FIG. 3, in white light emitting device 11, first light-emitting units 17a to 17d are arranged in two rows and two columns in the central portion on mounting substrate 13 so as to be connected in series by wiring electrodes 12. Accordingly, first light-emitting unit group 171 is formed. In addition, in FIG. 3, two of second light-emitting units 17e to 17h are arranged on the left side of first light-emitting unit group 171 and the other two of second light-emitting units 17e to 17h are arranged on the right side of first light-emitting unit group 171, so as to be connected in series by wiring electrodes 12. Accordingly, second light-emitting unit group 172 is formed. First light-emitting unit group 171 and second light-emitting unit group 172 are electrically separated from each other.

Although wiring electrodes 12 actually have a complicated shape corresponding to the electrode pattern of the LED chips, the shape is simplified in FIG. 3.

It is generally known that the chromaticity of a light-emitting unit changes according to the value of the applied current. As the current value applied to each LED chip increases, the emission wavelength of the LED chip shifts. An increase in the current value applied to each LED chip results in an increase in the amount of heat generated, which is considered to cause a decrease in wavelength conversion efficiency of the phosphor, a wavelength shift, or the like. Accordingly, the chromaticity of the combined light of the light from each LED chip and the light from each phosphor member shifts along with these phenomena. Here, changes in emission chromaticity in the light-emitting unit as described above will be described with reference to FIG. 4.

Figure 4:
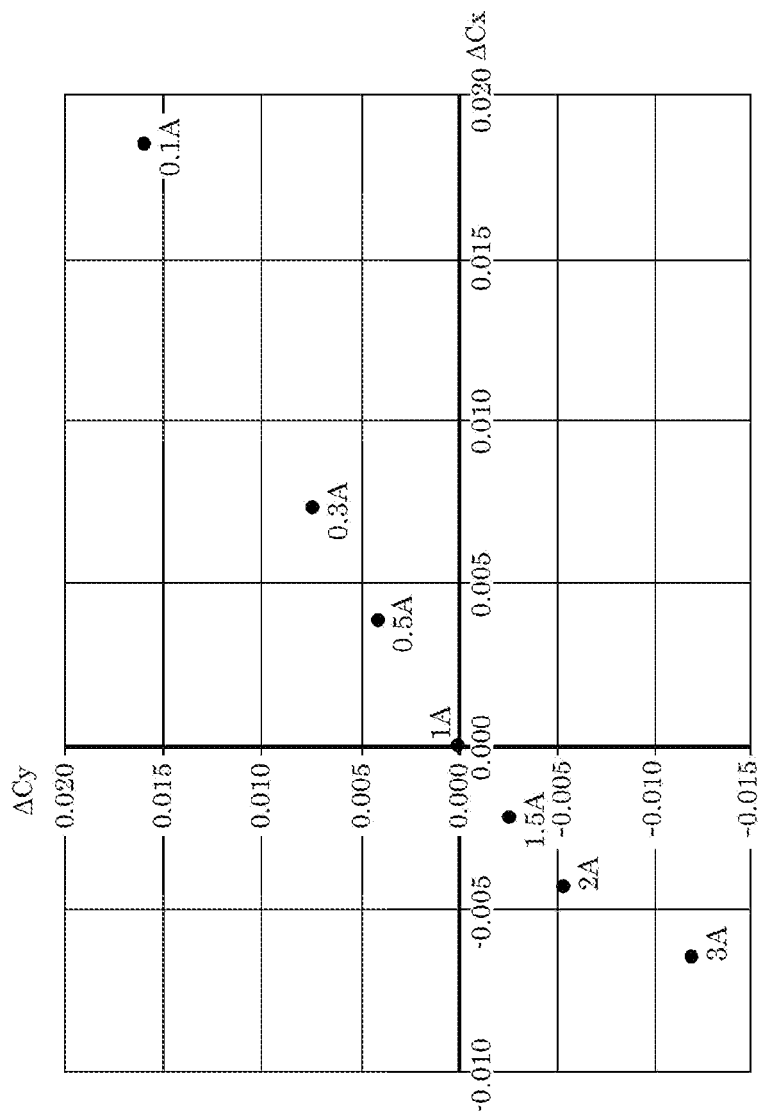
FIG. 4 is a graph indicating changes in average emission chromaticity in a white light emitting device according to a comparative example.

FIG. 4 is a graph indicating changes in average emission chromaticity in a white light emitting device according to a comparative example. Here, in a similar manner to white light emitting device 11 according to the present embodiment, the white light emitting device according to the comparative example includes a first light-emitting unit group arranged in the central portion and second light-emitting unit group arranged on the left and right sides of the first light-emitting unit group. FIG. 4 illustrates a change amount ($\Delta Cx$, $\Delta Cy$) of the average emission chromaticity of the second light-emitting unit group at the time of application of a current of 3 amperes to four 0.8 mm square LED chips of the first light-emitting unit group and a current of 0.1 ampere to 3 amperes is applied to four 0.8 mm square LED chips of the second light-emitting unit group. Here, in the white light emitting device according to the comparative example, the same LED chips and the same phosphor members are used in the first light-emitting unit group and the second light-emitting unit group. FIG. 4 illustrates differences from the average emission chromaticity at the time of application of a current of 1 ampere to the second light-emitting unit group.

As illustrated in FIG. 4, it can be understood that as the current increases, both Cx and Cy in the CIE coordinates representing the chromaticity decrease. When comparing the case where a current of 1 ampere is applied with the case where a current of 3 amperes is applied, both of which are assumed to be practically used in an in-vehicle headlamp, it can be understood that Cx and Cy in the CIE coordinates representing the emission chromaticity in the case of application of 3 amperes are respectively reduced by 0.0065 and 0.0119 relative to the case of application of 1 ampere. The direction of displacement of the emission chromaticity on the CIE coordinates is close to the direction toward the CIE coordinates representing the chromaticity of the LED chip. For this reason, it is considered that the main factor of the displacement is a decrease in the luminous efficacy of the phosphor in association with a rise in the temperature of the LED chip caused by an increase in current. Accordingly, it has been experimentally found that in the present embodiment, the ratio of light from the phosphor member at the time of driving at 1 ampere is 63.3%, while it is reduced to 60.8% at the time of driving at 3 amperes.

Here, the identical colors can be expressed by using a MacAdam ellipse when the CIE coordinate system is used. Steps 1 to 7 are defined for the MacAdam ellipse, and it is said that the human eyes cannot distinguish colors inside the 3-step MacAdam ellipse. The MacAdam ellipse is obtained from experimental values of human vision, and the shape of the ellipse differs depending on the color. More simply, a rectangle circumscribing the 3-step MacAdam ellipse and having sides parallel to the Cx axis and the Cy axis is used for determination of the identical colors.

Figure 5:
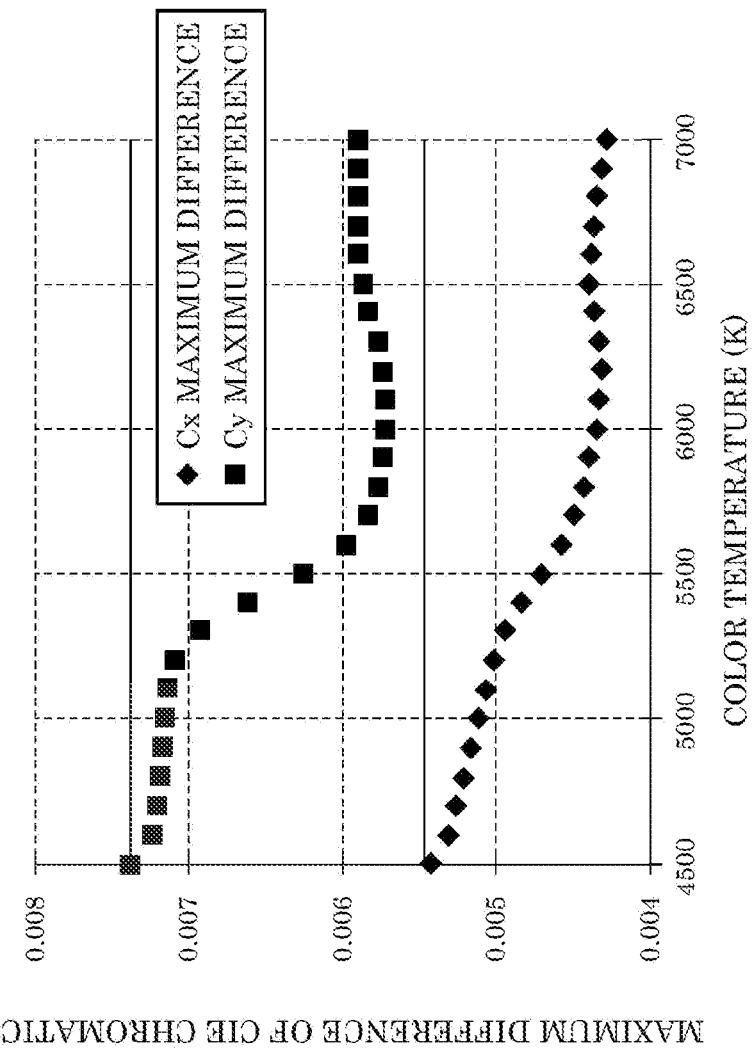
FIG. 5 is a graph indicating maximum differences of CIE chromaticity in Cx and Cy directions of a rectangle circumscribing a 3-step MacAdam ellipse with respect to Cx and Cy of white light in a range of 4500K to 7000K.

For example, in the case of an in-vehicle headlamp, white light with a color temperature of approximately 5700 K is currently used in many cases. In the present disclosure, light with a color temperature of 4500 K to 7000 K is defined as white light. FIG. 5 is a graph indicating the maximum difference of CIE chromaticity in the Cx and Cy directions of a rectangle circumscribing the 3-step MacAdam ellipse relative to Cx and Cy of white light in the range of 4500 K to 7000 K. From FIG. 5, it can be defined that the chromaticities are the identical colors when Cx is less than 0.0055 and Cy is less than 0.0074 from the center in the CIE coordinates.

According to the definition of the identical colors described above, the chromaticity difference at the time of application of currents of 1 ampere and 3 amperes to the light-emitting units according to the comparative example is greater than the rectangle circumscribing the 3-step MacAdam ellipse, which can be said to be the non-identical colors.

Here, the emission chromaticity of each light-emitting unit group in white light emitting device 11 according to the present embodiment will be described with reference to FIG. 6A and FIG. 6B.

Figure 6A:
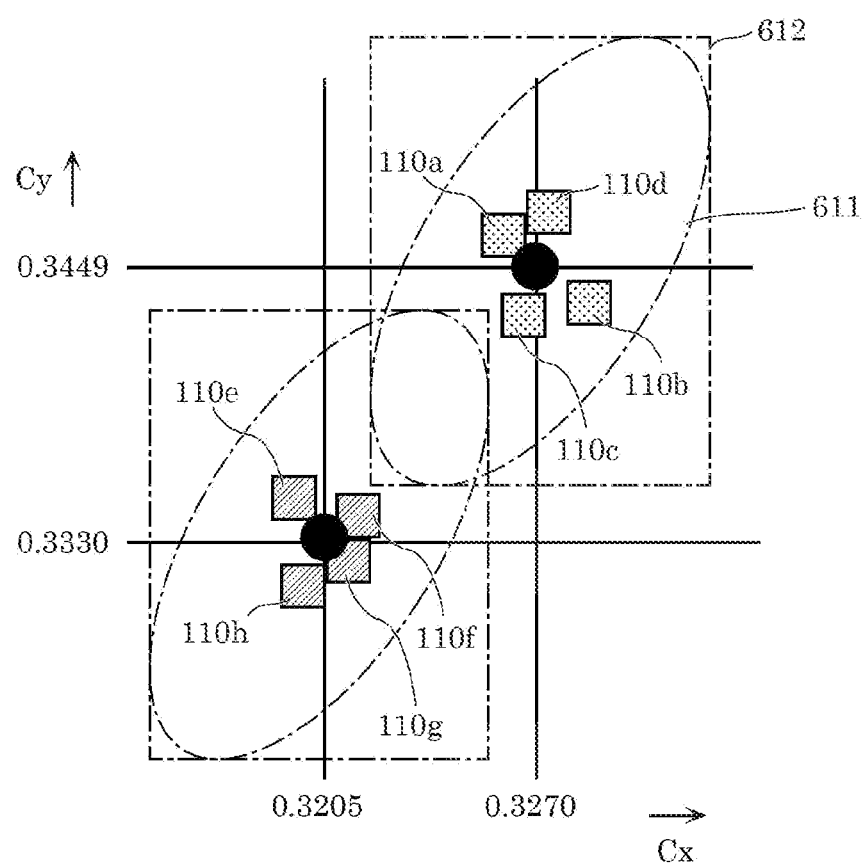
FIG. 6A illustrates an example of a distribution of emission chromaticities of light-emitting units according to Embodiment 1.
Figure 6B:
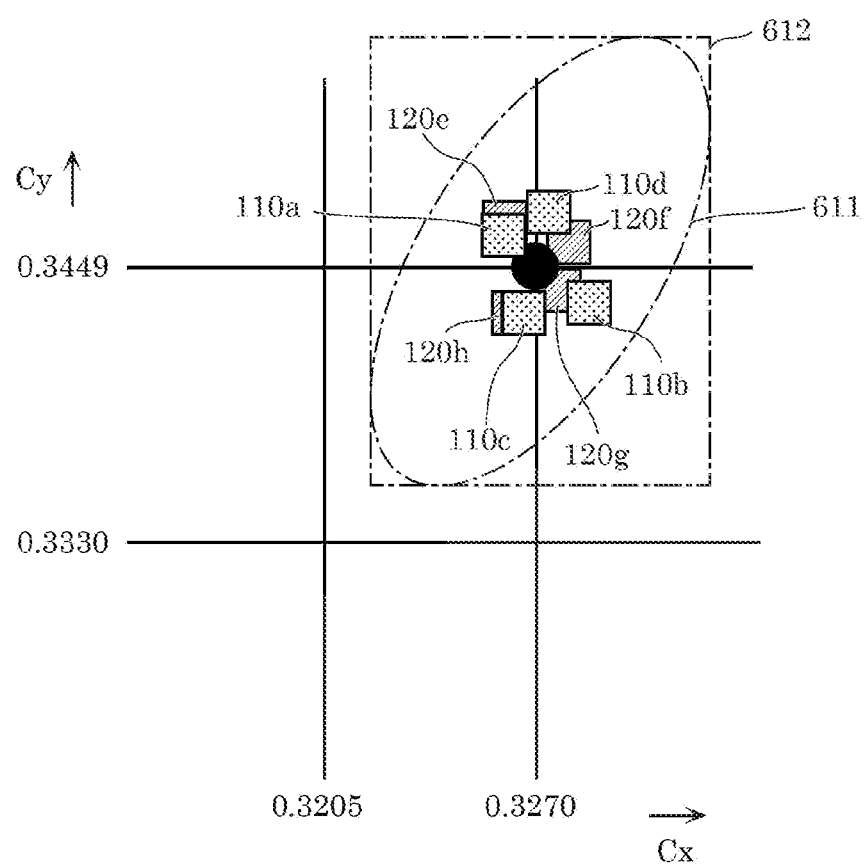
FIG. 6B illustrates another example of the distribution of the emission chromaticities of the light-emitting units according to Embodiment 1.

FIG. 6A and FIG. 6B illustrate examples of the emission chromaticity distribution of each light-emitting unit according to the present embodiment.

In white light emitting device 11 according to the present embodiment, in the state where rated currents are used, a first rated current of 3 amperes is applied to each first light-emitting unit of first light-emitting unit group 171. On the other hand, a second rated current of 1 ampere is applied to each second light-emitting unit of second light-emitting unit group 172.

In FIG. 6A, the CIE coordinate group on the upper right indicates the emission chromaticity of each first light-emitting unit at the time of application of the first rated current of 3 amperes to first light-emitting unit group 171. Here, the first rated current is an example of a first current according to the present embodiment. CIE coordinates 110a to 110d illustrated in FIG. 6A indicate the emission chromaticities of first light-emitting units 17a to 17d, respectively. In this case, the CIE coordinates (Cx11, Cy11) representing the average emission chromaticity of all of the first light-emitting units are (0.3270, 0.3449). CIE coordinates 110a to 110d representing the emission chromaticity of each first light-emitting unit are inside the 3-step MacAdam ellipse centered around the CIE coordinates (Cx11, Cy11) representing the average emission chromaticity.

In FIG. 6A, the CIE coordinate group on the lower left indicates the emission chromaticity of each second light-emitting unit at the time of application of the first rated current of 3 amperes to second light-emitting unit group 172. CIE coordinates 110e to 110h illustrated in FIG. 6A indicate the emission chromaticities of second light-emitting units 17e to 17h, respectively. In this case, the CIE coordinates (Cx21, Cy21) representing the average emission chromaticity of all of the second light-emitting units are (0.3205, 0.3330). CIE coordinates 110e to 110h representing the emission chromaticity of each second light-emitting unit are inside the 3-step MacAdam ellipse centered around the CIE coordinates (Cx21, Cy21) representing the average emission chromaticity.

Here, the differences of Cx and Cy coordinates (|Cx11−Cx21|, |Cy11−Cy21|) between the CIE coordinates (Cx11, Cy11) representing the average emission chromaticity of all of the first light-emitting units and the CIE coordinates (Cx21, Cy21) representing the average emission chromaticity of all of the second light-emitting units are (0.0065, 0.0119). Accordingly, the above two average emission chromaticities do not satisfy the conditions "ΔCx is less than 0.0055 and ΔCy is less than 0.0074", corresponding to that the two average emission chromaticities are inside rectangle 612 circumscribing 3-step MacAdam ellipse 611, which is the condition for the identical colors. As described above, the average emission chromaticity of first light-emitting unit group 171 and the average emission chromaticity of second light-emitting unit group 172 are non-identical colors. When white light emitting device 11 is installed in the headlamp unit and the road surface is illuminated under the conditions that the first rated current (3 amperes) is actually applied to each first light-emitting unit and each second light-emitting unit, the color of the road surface looks different between the central portion and the surrounding portion in the light distribution pattern. As described above, the non-identical colors may be defined to satisfy relation of |Cx11−Cx21|≥0.0055 or |Cy11−Cy21|≥0.0074.

On the other hand. FIG. 6B illustrates CIE coordinates 110a to 110d representing the emission chromaticities of first light-emitting units 17a to 17d at the time of application of the first rated current of 3 amperes to first light-emitting units 17a to 17d. FIG. 6B illustrates CIE coordinates 120e to 120h representing the emission chromaticities of second light-emitting units 17e to 17h at the time of application of the second rated current of 1 ampere to second light-emitting units 17e to 17h. Here, the second rated current is an example of a second current according to the present embodiment. The CIE coordinates (Cx22, Cy22) representing the average emission chromaticity of second light-emitting unit group 172 at the time of application of the second rated current of 1 ampere to each second light-emitting unit is (0.3270, 0.3449). As described above, the CIE coordinates (Cx11, Cy11) representing the average emission chromaticity of first light-emitting unit group 171 are (0.3270, 0.3449). Hence, the Cx coordinate difference |Cx11−Cx22| of the average emission chromaticity between second light-emitting unit group 172 and first light-emitting unit group 171 is less than 0.0055, and the Cy coordinate difference |Cy11−Cy22| is less than 0.0074. Accordingly, the average emission chromaticity of first light-emitting unit group 171 and the average emission chromaticity of second light-emitting unit group 172 can be said to be the identical colors. When white light emitting device 11 is installed in a headlamp unit, and the road surface is illuminated in the state where the first rated current of 3 amperes is applied to each first light-emitting unit, and the second rated current of 1 ampere is applied to each second light-emitting unit, the color of the road surface looks the same in the central portion and the surrounding portion. As described above, the identical colors may be defined to satisfy relations of |Cx11−Cx22|<0.0055 and |Cy11−Cy22|<0.0074.

Figure 6C:
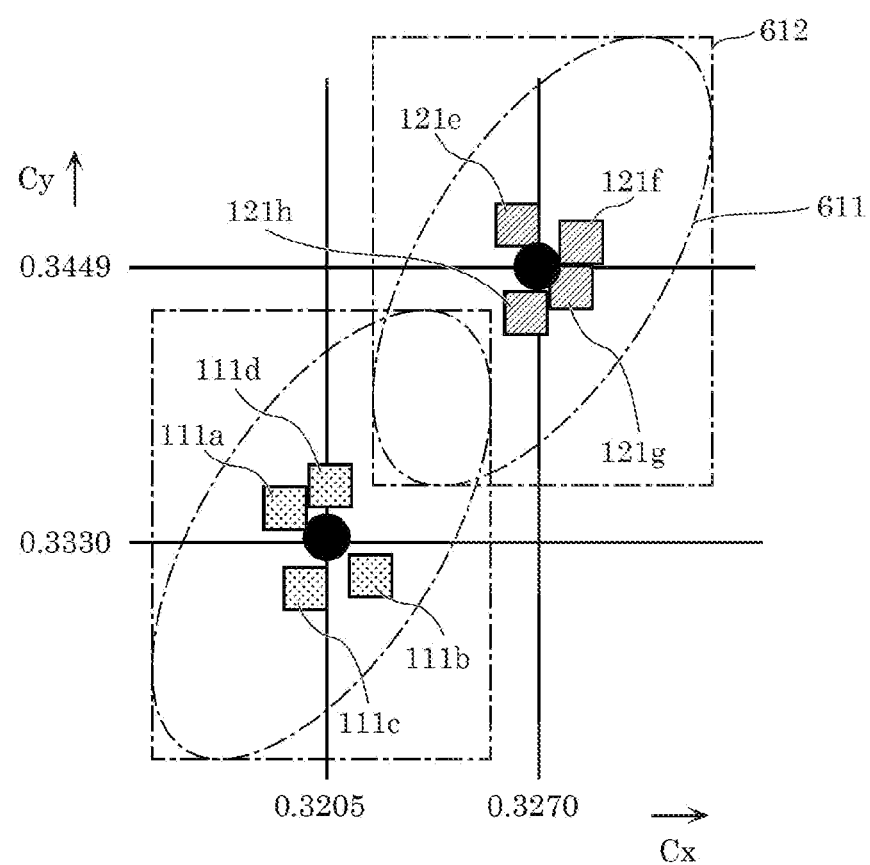
FIG. 6C illustrates an example of a distribution of emission chromaticities of light-emitting units according to the comparative example.

Here, the emission chromaticity distribution of the respective light-emitting units according to the comparative example will be described with reference to FIG. 6C. FIG. 6C illustrates an example of the emission chromaticity distribution of the light-emitting units according to the comparative example. In the white light emitting device according to the comparative example, as described above, the same LED chips and the same phosphor members are used in the first light-emitting unit group and the second light-emitting unit group. For example, phosphor members are used each of which has a chromaticity of (0.4240, 0.5220) which is the same as the second phosphor members according to the present embodiment. FIG. 6C illustrates CIE coordinates 111a to 111d representing the emission chromaticities of the first light-emitting units at the time of application of the first rated current of 3 amperes to each first light-emitting unit. FIG. 6C illustrates CIE coordinates 121e to 121h representing the chromaticity distribution of the second light-emitting units at the time of application of the second rated current of 1 ampere to each second light-emitting unit. In this case, the average emission chromaticity of the first light-emitting unit group is (0.3205, 0.3330), and the average emission chromaticity of the second light-emitting unit group is (0.3270, 0.3449). In this case, the difference between the CIE coordinates representing the average emission chromaticities of the first light-emitting unit group and the second light-emitting unit group is (0.0065, 0.0119). The difference does not satisfy the condition that "ΔCx is less than 0.0055 and ΔCy is less than 0.074" corresponding to being inside rectangle 612 circumscribing the 3-step MacAdam ellipse 611 which is the condition for the identical colors. As described above, the average emission chromaticity of the first light-emitting unit group and the average emission chromaticity of the second light-emitting unit group are non-identical colors.

Here, the case has been described where the first rated current (3 amperes) and the second rated current (1 ampere) are respectively used as the first current and the second current in white light emitting device 11 according to the present embodiment. However, the values of the first current and the second current are not limited to such an example. Any first and second current values can be applied which have such a drive current difference that the difference in chromaticity caused by the difference in current at the time of use of the same light-emitting units in the central portion and the surrounding portion of the white light emitting device is ΔCx≥0.0055 or ΔCy≥0.0074.

For example, in the present embodiment, the case will be described where the average value (CxP1, CyP1) of the chromaticities of all of the first phosphor members is (0.4306, 0.5340), and the average value (CxP2, CyP2) of the chromaticities of all of the second phosphor members is (0.4240, 0.5220). In this case, when a current of 2.4 amperes is applied to each light-emitting unit, the emission intensity of the phosphor member is reduced from 63.3% to 61.7% due to the influence of temperature rise or the like because of the current. Accordingly, the CIE coordinates representing the chromaticity of the mixed color respectively emitted from first light-emitting unit group 171 and second light-emitting unit group 172 are (0.3270, 0.3449) and (0.3215, 0.3375), respectively. On the other hand, the CIE coordinates representing the chromaticity of the mixed color emitted from the second light-emitting unit group at the time of application of a current of 1.0 ampere to each second light-emitting unit of the second light-emitting unit group is (0.3270, 0.3449).

In other words, when a current of 2.4 amperes is applied to the first light-emitting unit group and a current of 1.0 ampere is applied to the second light-emitting unit group, the chromaticities in both cases are (0.3270, 0.3449). In contrast, when a current of 2.4 amperes is applied to both the first light-emitting unit group and the second light-emitting unit group, the difference between the CIE coordinates representing the chromaticities of the first light-emitting unit group and the second light-emitting unit group is (0.055 (=0.3270−0.3215), 0.074 (=0.03449−0.3375)). This difference in chromaticity corresponds to the boundary value between the identical colors and the non-identical colors defined in the present embodiment. Accordingly, at the time of driving of white light emitting device 11 according to the present embodiment, the chromaticity difference between the first phosphor member and the second phosphor member when the emission chromaticities of first light-emitting unit group 171 and second light-emitting unit group 172 are identical colors is (0.0066(=0.4306−0.4240), 0.0120 (=0.5340−0.5220)). This is the boundary value of the chromaticity difference between the first phosphor member and the second phosphor member when the advantageous effects of white light emitting device 11 according to the present embodiment are provided.

In other words, in cases where the same color LED chips are used for the first light-emitting units and the second light-emitting units, and where the first phosphor members and the second phosphor members are used which have the chromaticity difference of at least a predetermined value of (0.0066, 0.0120), it can be said that when the same current is applied to each light-emitting unit, the emission chromaticities of the light-emitting unit groups are non-identical colors, and when a specific rated current is applied to each light-emitting unit, the emission chromaticities of the light-emitting unit groups can be identical colors. In other words, in cases where the average value of the chromaticities of all of the first phosphor members included in the first light-emitting unit group is represented by the CIE coordinates (CxP1, CyP1), and where the average value of the chromaticities of all of the second phosphor members included in the second light-emitting unit group is represented by the CIE coordinates (CxP2, CyP2), the emission chromaticities of first light-emitting unit group 171 and second light-emitting unit group 172 can be made identical colors when relations of 0.0066≤|CxP1−CxP2| and 0.0120≤|CyP1−CyP2| are satisfied.

In addition, here, the difference between the Cx value and the Cy value in the CIE coordinate values was used as the range of the identical colors. In other words, the inside of the rectangle circumscribing the 3-step MacAdam ellipse was used as the range of the identical colors. More strictly, the inside of the 3-step MacAdam ellipse may be used as the range of the identical colors. When this range is used, too, the advantageous effects of white light emitting device 11 according to the present embodiment can be achieved by adjusting the chromaticity of each phosphor member according to the first current and the second current.

Here, when the chromaticity dispersion of the light-emitting units in each group is within a certain range, the effect that the chromaticities look identical colors is more remarkable. Specifically, in the case where the emission chromaticity of each light-emitting unit at the time of application of the first current to n first light-emitting units is represented by CIE coordinates (Cx11i, Cy11i) (1≤i≤n), when all of the CIE coordinates (Cx11i, Cy11i) are inside the region represented by |Cx11−Cx11i|<0.0055 and |Cy11−Cy11i|<0.0074 corresponding to the rectangle circumscribing the 3-step MacAdam ellipse, the effect that the chromaticities look identical colors is more remarkable.

In a similar manner, in the case where the emission chromaticity of each light-emitting unit at the time of application of the first current to m second light-emitting units is represented by CIE coordinates (Cx21i, Cy21i) (1≤i≤m), when all of the CIE coordinates (Cx21i, Cy21i) are inside the region represented by |Cx21−Cx21i|<0.0055 and |Cy21−Cy21i|<0.0074 corresponding to the rectangle circumscribing the 3-step MacAdam ellipse, the effect that the chromaticities look identical colors is more remarkable.

Additionally, in a similar manner, when the CIE coordinates (Cx11i, Cy11i) and (Cx21i, Cy21i) representing the emission chromaticities of all of the light-emitting units are inside the 3-step MacAdam ellipse centered around the average emission chromaticities, the effect that both the light-emitting unit groups of white light emitting device 11 in which both are combined look identical colors is even more remarkable.

Here, first phosphor members 16a to 16d included in first light-emitting unit group 171 and second phosphor members 16e to 16h included in second light-emitting unit group 172 have different chromaticities due to different phosphor compositions (constituent element component ratios). However, the configuration of each phosphor member is not limited to such an example. For example, when different phosphor species are used, such as the case where the first phosphor member in which garnet-based phosphor is dispersed is used and the second phosphor member in which a silicate-based phosphor is dispersed is used, when the concentration of the activated element species (for example, cerium) in the phosphor is changed or when the chromaticity is changed using a combination thereof, the same advantageous effects can be obtained as long as the chromaticity of each phosphor member is the same as those in the present embodiment.

In white light emitting device 11, four light-emitting units are arranged in the central portion as first light-emitting unit group 171 and two light-emitting units are arranged on the left side and two light-emitting units are arranged on the right side of first light-emitting unit group 171 as second light-emitting unit group 172. However, the arrangement of the light-emitting units are not limited to such an example. For example, it may be that the first light-emitting unit group which includes two first light-emitting units arranged side by side and connected in series is arranged on the upper part of the central portion and that as the second light-emitting unit group, two second light-emitting units are arranged on each of below, left and right sides of the first light-emitting unit group so that a total of six second light-emitting units are connected in series. In particular, this configuration is useful as a light source for a low beam of an in-vehicle headlamp that requires a hot zone in the upper center.

There is no particular limitation on the number of light-emitting units to be arranged and the serial or parallel electrical connection configuration. The same advantageous effects can be obtained also by arranging the first light-emitting unit group, in which four columns each including a row of four light-emitting units are arranged, in the central portion, and arranging the second light-emitting unit group in which two columns each including a row of four light-emitting units are arranged on each of the left and right sides of the first light-emitting unit group.

Embodiment 2

A white light emitting device according to Embodiment 2 will be described. The white light emitting device according to the present embodiment is different from white light emitting device 11 according to Embodiment 1 in configuration of the phosphor member. Hereinafter, the white light emitting device according to the present embodiment will be described focusing on the differences from Embodiment 1.

[2-1. Basic Configuration]

Figure 7:
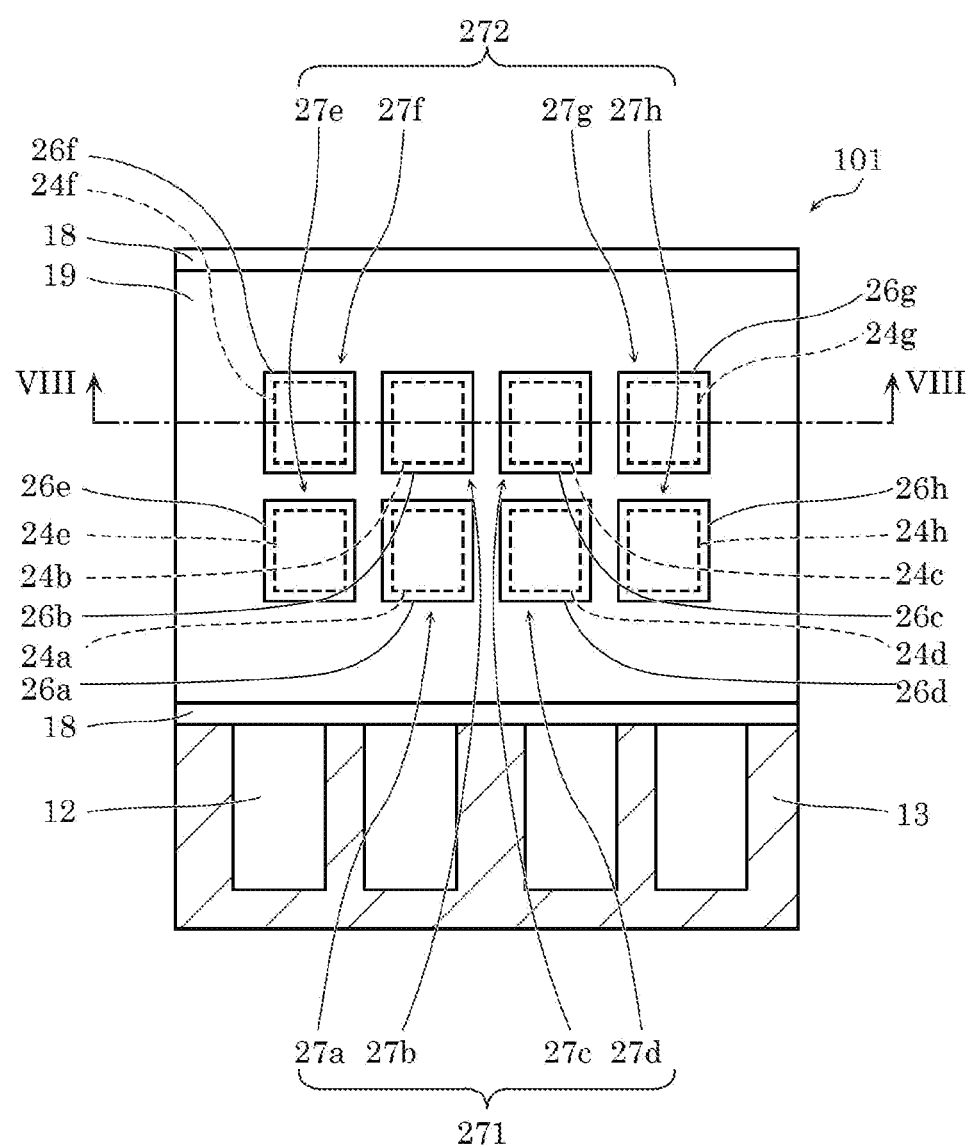
FIG. 7 is a schematic top view of an example of a configuration of a white light emitting device according to Embodiment 2.
Figure 8:
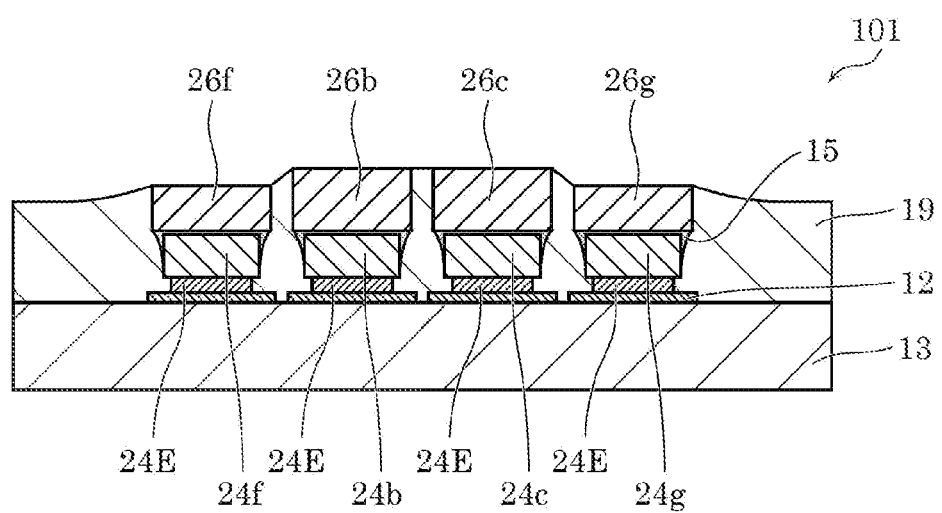
FIG. 8 is a cross-sectional view of an example of a configuration of the white light emitting device according to Embodiment 2.

The basic configuration of the white light emitting device according to the present embodiment will be described with reference to FIG. 7 and FIG. 8. FIG. 7 and FIG. 8 are respectively a schematic top view and a cross-sectional view of an example of a configuration of white light emitting device 101 according to the present embodiment. FIG. 8 illustrates a cross section taken along line VIII-VIII of white light emitting device 101 in FIG. 7.

White light emitting device 101 according to the present embodiment includes, as illustrated in FIG. 7, first light-emitting unit group 271, second light-emitting unit group 272, and mounting substrate 13. White light emitting device 101 further includes frames 18 and reflective resin 19.

First light-emitting unit group 271 includes a plurality of first light-emitting units 27a to 27d to which a first current is applied. Each of first light-emitting units 27a to 27d includes a first LED chip and a first phosphor member. As illustrated in FIG. 7, first light-emitting units 27a to 27d includes first LED chips 24a to 24d and first phosphor members 26a to 26d, respectively. Each of first light-emitting units 27a to 27d is arranged adjacent to at least another one of first light-emitting units 27a to 27d.

Second light-emitting unit group 272 includes a plurality of second light-emitting units 27e to 27h to which a second current is applied. Each of second light-emitting units 27e to 27h includes a second LED chip and a second phosphor member. As illustrated in FIG. 7, second light-emitting units 27e to 27h include second LED chips 24e to 24h and second phosphor members 26e to 26h, respectively. Each of second light-emitting units 27e to 27h is arranged adjacent to at least another one of second light-emitting units 27e to 27h.

In Embodiment 2, in a similar manner to Embodiment 1, each of the first LED chips and the second LED chips have emission chromaticities which can be considered as the same and emission intensities which can be considered as the same.

First phosphor members 26a to 26d used in first light-emitting unit group 271 have emission chromaticities which can be considered as the same and emission intensities which can be considered as the same, and second phosphor members 26e to 26h used in second light-emitting unit group 272 also have emission chromaticities which can be considered as the same and emission intensities which can be considered as the same.

Moreover, when the first phosphor members and the second phosphor members are compared, the phosphor concentration of each first phosphor member may be greater than the phosphor concentration of each second phosphor member, and each first phosphor member may be thicker than each second phosphor member. Hence, when the same current, such as the first rated current, is applied to each light-emitting unit, the average emission intensities of the light-emitting unit groups are the same. Relative to the average emission chromaticity, the CIE coordinates representing the average emission chromaticity of second light-emitting unit group 272 is either on or outside the 3-step MacAdam ellipse centered around the CIE coordinates representing the average emission chromaticity of first light-emitting unit group 271.

When the first rated current is applied to each first light-emitting unit and the second rated current is applied to each second light-emitting unit, the first rated current and the second rated current are selected such that the CIE coordinates representing the average emission chromaticity of second light-emitting unit group 272 are inside the 3-step MacAdam ellipse centered around the CIE coordinates representing the average emission chromaticity of first light-emitting unit group 271 and that the average emission intensity of first light-emitting unit group 271 is greater than second light-emitting unit group 272. Here, the first rated current and the second rated current are examples of a first current and a second current according to the present embodiment, respectively.

[2-2. Detailed Configuration]

Next, a detailed configuration of white light emitting device 101 according to the present embodiment will be described.

In the present embodiment, the LED chips have the same chip size, the same semiconductor stack structure, the same rated current and the same rated wavelength (rated chromaticity). Moreover, for the first phosphor members and the second phosphor members, plate-shaped phosphor members with the same material and emission chromaticities which are identical colors are used. However, the first phosphor members are different from the second phosphor members in thickness.

The LED chips which are the same as those in Embodiment 1 are used. The CIE coordinates representing the average value of the emission chromaticities of the LED chips are (0.1600, 0.0400).

In a similar manner to Embodiment 1, for each phosphor member, a composite of plate-shaped YAG and ceramics is used in which the occupancy of YAG is 20% by volume, the average emission chromaticity is represented by the CIE coordinates (0.4347, 0.5416), and variations ($\Delta$Cx, $\Delta$Cy) thereof is less than (0.0040, 0.0040). In the present embodiment, two species of phosphor members which are different in thickness are prepared. Each of the first phosphor members has a thickness of 100.0 µm, and each of the second phosphor members has a thickness of 96.1 µm. These phosphor members have a thickness distribution of about 3 µm due to manufacturing errors.

When each of the phosphor members which are different in thickness are irradiated with light having a wavelength equal to the emission wavelength of a corresponding LED chip, the emission chromaticity is represented by the CIE coordinates (0.4306, 0.5416), and the variations ($\Delta$Cx, $\Delta$Cy) is less than ($\pm$0.0040, $\pm$0.0040). On the other hand, the ratio of the emission intensity of the first phosphor member to the second phosphor member is 100.0 to 96.1, and the emission intensity is substantially proportional to the thickness of the phosphor member.

In a similar manner to Embodiment 1, in the present embodiment, four first LED chips 24a to 24d are flip-chip mounted in the central portion on mounting substrate 13, and first phosphor members 26a to 26d are adhered onto first LED chips 24a to 24d respectively, so that first light-emitting unit group 271 is formed. Four first LED chips 24a to 24d are connected in series on mounting substrate 13 by wiring electrodes 12. As illustrated in FIG. 8, wiring electrodes 12 are connected to element electrodes 24E of the respective LED chips.

Moreover, two of second LED chips 24e to 24h are flip-chip mounted on the left side of first light-emitting unit group 271 on mounting substrate 13 and the other two are flip-chip mounted on the right side of first light-emitting unit group 271, and second phosphor members 26e to 26h are adhered onto second LED chips 24e to 24h respectively, so that second light-emitting unit group 272 is formed. Four second LED chips 24e to 24h are connected in series on mounting substrate 13 by wiring electrodes 12. As illustrated in FIG. 8, wiring electrodes 12 are connected to element electrodes 24E of the respective LED chips.

Here, the emission chromaticity of each light-emitting unit group in white light emitting device 101 according to the present embodiment will be described with reference to FIG. 6A and FIG. 6B.

First, the case where the first rated current of 3 amperes is applied to each first light-emitting unit and each second light-emitting unit will be described with reference to FIG.

6A. In a similar manner to the emission chromaticity of each light-emitting unit group according to Embodiment 1, in the above case, the light emission from the phosphor is 60.8% among the light emission from the first light-emitting unit as in Embodiment 1. The average emission chromaticity of all of the first light-emitting units is represented by the CIE coordinates (0.3270, 0.3449). In a similar manner to Embodiment 1, the CIE coordinates of the emission chromaticities of first light-emitting units 27a to 27d are represented by coordinates 110a to 110d, respectively. As illustrated in FIG. 6A, although the CIE coordinates of the emission chromaticity of each light-emitting unit have a distribution, the CIE coordinates are inside the rectangle circumscribing the 3-step MacAdam ellipse centered around the CIE coordinates of the average emission chromaticity.

When the first rated current of 3 amperes, which is the same as the current applied to each first light-emitting unit, is applied to each second light-emitting unit, the CIE coordinates of the emission chromaticities of second light-emitting units 27e to 27h are represented by coordinates 110e to 110h in a similar manner to Embodiment 1, respectively. Moreover, the CIE coordinates representing the average emission luminance of the second light-emitting units are the CIE coordinates (0.3205, 0.3330) which is different from the CIE coordinates representing the average emission luminance of the first light-emitting units. This is because the emission intensity from each second phosphor member is 96.1% relative to the emission intensity from each first phosphor member as described above. Here, as illustrated in FIG. 6A, the CIE coordinates representing the emission chromaticity of each second light-emitting unit are inside the rectangle circumscribing the 3-step MacAdam ellipse centered around the CIE coordinates of the average emission chromaticity. On the other hand, the difference ($\Delta$Cx, $\Delta$Cy) between the CIE coordinates representing the emission chromaticity of each second light-emitting unit and the CIE coordinates representing the average chromaticity of the first light-emitting units is (0.0065, 0.0119). This does not satisfy the condition that "$\Delta$Cx is less than 0.0055 and $\Delta$Cy is less than 0.0074" corresponding to being inside the rectangle circumscribing the 3-step MacAdam ellipse, which is the condition for the identical colors. Hence, the emission chromaticity of the second light-emitting unit group and the emission chromaticity of the first light-emitting unit group are non-identical colors.

In the present embodiment, by using, for each second phosphor member, a phosphor member thinner than each first phosphor member, the emission intensity from each second phosphor member is less than the emission intensity from a corresponding second LED chip. For this reason, combined light closer to light emission (blue light) from the second LED chip is obtained from the second light-emitting unit.

The CIE coordinates representing the average emission chromaticity of the second light-emitting unit group at the time of application of the second rated current of 1 ampere to each second light-emitting unit according to the present embodiment are (0.3270, 0.3449) as illustrated in FIG. 6B, in a similar manner to Embodiment 1. In addition, the CIE coordinates of the emission chromaticity of each light-emitting unit is inside a rectangle circumscribing the 3 step MacAdam ellipse centered around the CIE coordinates of the average emission chromaticity. As described above, the difference between the CIE coordinates representing the average emission chromaticity of first light-emitting unit group 271 at the time of application of the first rated current to each first light-emitting unit and the CIE coordinates representing the average emission chromaticity of second light-emitting unit group 272 at the time of application of the second rated current to each second light-emitting unit satisfies relations of $|Cx11-Cx22|<0.0055$ and $|Cy11-Cy22|<0.0074$. Accordingly, it can be said that the average emission chromaticity of the first light-emitting unit group and the average emission chromaticity of the second light-emitting unit group are identical colors.

In the case where white light emitting device 101 according to the present embodiment is installed in a headlamp unit, and the road surface is illuminated in the state where the first rated current of 3 amperes is applied to the first light-emitting unit group and the second rated current of 1 ampere is applied to the second light-emitting unit group, the target object looks identical in color in the central portion and the surrounding portion.

Next, a boundary value at which the emission chromaticity of first light-emitting unit group 271 and the emission chromaticity of second light-emitting unit group 272 can be identical colors will be described.

For example, the case will be studied where a phosphor member having a thickness of 100.0 µm is used for each first phosphor member and a phosphor member having a thickness of 97.6 µm is used for each second phosphor member, and the first current of 2.4 amperes, which is the same as the current applied to each first light-emitting unit, is applied to each second light-emitting unit. In this case, the CIE coordinates representing the average emission chromaticity of all of the first light-emitting units are (0.3285, 3449) and the average emission chromaticity of all of the second light-emitting units are (0.3244, 0.3375). The difference ($\Delta$Cx, $\Delta$Cy) between these CIE coordinates is (0.0041, 0.0074), which corresponds to the boundary of the rectangle circumscribing the 3 step MacAdam ellipse which is the condition for the identical colors. In other words, it means that in the case where the thickness of each second phosphor member is greater than 97.6 µm and less than or equal to 100 µm, the emission chromaticity of first light-emitting unit group 271 and the emission chromaticity of second light-emitting unit group 272 are identical colors. Moreover, in the case where a phosphor member having a thickness of, for example, 95.4 µm is used for each second phosphor member and the first current of 2.4 amperes, which is the same as the current applied to each first light-emitting unit, is applied to each second light-emitting unit, the CIE coordinates representing the average emission chromaticity of all of the first light-emitting units are (0.3285, 3449) and the average emission chromaticity of all of the second light-emitting units are (0.3187, 0.3304). The differences ($\Delta$Cx, $\Delta$Cy) between those coordinates are (0.0098, 0.0145), which corresponds to the outside of the rectangle circumscribing the 3 step MacAdam ellipse which is a condition for non-identical colors. On the other hand, in the case where a current of 1 ampere is applied to each second light-emitting unit, the CIE coordinates representing the average emission chromaticity of all of the second light-emitting units are (0.3225, 0.3375). Hence, the differences ($\Delta$Cx, $\Delta$Cy) between the CIE coordinates representing the average emission chromaticity of all of the first light-emitting units and the CIE coordinates representing the average emission chromaticity of all of the second light-emitting units are (0.0060, 0.0074), which corresponds to the boundary of the rectangle circumscribing the 3-step MacAdam ellipse which is a condition for the identical colors. In other words, in the case where the thickness of each second phosphor member is less than 95.4 µm, even when the first rated current and the second rated current are respectively applied to each first light-emitting unit and each second light-emitting unit, the emission chromaticities of the light-emitting unit groups are not identical colors.

That is, in the present embodiment, when the thickness of each first phosphor member is 100.0 μm and the thickness of each second phosphor member is greater than 95.4 μm and less than 97.6 μm, the emission chromaticity of the first light-emitting unit group and the emission chromaticity of the second light-emitting unit group can be identical colors.

In other words, in the cases where light having a wavelength equal to the emission wavelength of the LED chips included in the first light-emitting unit group or second light-emitting unit group is emitted to the first phosphor members or the second phosphor members, and where P1 is the average value of the emission intensities of the first phosphor members and P2 is the average value of the emission intensities of the second phosphor members, the emission chromaticities of the first light-emitting unit group and the second light-emitting unit group can be identical colors when the relation of $0.954 \leq P2/P1 \leq 0.976$ is satisfied.

The description has been given above where the phosphors which are the same in area and different in thickness are used for the first phosphor members and the second phosphor members. However, the configuration of each phosphor member is not limited to such an example. The emission intensity from a phosphor member is substantially proportional to the product of the volume of the phosphor member and the volume density of the phosphor particles included in the phosphor member. Therefore, when the volume of the phosphor member is constant, the emission intensity is substantially proportional to the volume concentration of the phosphor particles. When the volume concentration of the phosphor particles is constant, the emission intensity is substantially proportional to the volume of the phosphor member.

In other words, in the first phosphor members and the second phosphor members, in the case where the dimensions (the bottom area and the height in the case of a plate-shaped phosphor member) of the phosphor members are the same, and the emission chromaticities of the phosphors are identical colors, and when D1 is the average value of the volume concentration of the phosphor particles in the first phosphor member, and D2 is the average value of the volume concentration of the phosphor particles in the second phosphor member, white light emitting device 101 according to the present embodiment can be achieved in the range of $0.954 \leq D2/D1 \leq 0.976$. That is, in the first phosphor members and the second phosphor members, in the case where the emission chromaticities of the phosphors are identical colors, VP1 is the average value of the volumes of all of the first phosphor members included in the first light-emitting unit group, and VP2 is the average value of the volumes of all of the second phosphor members included in the second light-emitting unit group, white light emitting device 101 according to the present embodiment can be achieved when the relations of $0.954 \leq D2/D1 \leq 0.976$ and VP1=VP2 are satisfied.

In other words, when a current of 2.4 amperes, which is the boundary value, is applied to each first light-emitting unit and each second light-emitting unit, the emission chromaticity of the first light-emitting unit group and the emission chromaticity of the second light-emitting unit group are non-identical colors. When a current of 2.4 amperes is applied to each first light-emitting unit and a current of 1 ampere is applied to each second light-emitting unit, the emission chromaticity of the first light-emitting unit group and the emission chromaticity of the second light-emitting unit group are identical colors.

In a similar manner, in the case where the average value of the volume concentration of the phosphor particles in each first phosphor member and each second phosphor member and the emission chromaticities of the phosphors are identical colors, VP1 is the average value of the volumes of all of the first phosphor members and VP2 is the average value of the volumes of all of the second phosphor members, white light emitting device 101 according to the present embodiment can be achieved when the relation of $0.954 \leq VP2/VP1 \leq 0.976$ is satisfied. In other words, white light emitting device 101 according to the present embodiment can be achieved when, in the first phosphor members and the second phosphor members, the emission chromaticities of the phosphors are identical colors, and the relations of $0.954 \leq VP2/VP1 \leq 0.976$ and D1=D2 are satisfied.

In other words, when a current of 2.4 amperes, which is the boundary value, is applied to each first light-emitting unit and each second light-emitting unit, the emission chromaticity of the first light-emitting unit group and the emission chromaticity of the second light-emitting unit group are non-identical colors. When a current of 2.4 amperes is applied to each first light-emitting unit and a current of 1 ampere is applied to each second light-emitting unit, the emission chromaticity of the first light-emitting unit group and the emission chromaticity of the second light-emitting unit group are identical colors.

(Variations)

Although the white light emitting device according to the present disclosure has been described based on the embodiments, the present disclosure is not limited to such embodiments.

For example, in the above embodiments, white light emitting device 11 includes eight light-emitting units, but the number of light-emitting units does not have to be eight. The number of light-emitting units may be at least two.

Moreover, in the above embodiments, each light-emitting unit includes one LED chip, but may include a plurality of LED chips. For example, one light-emitting unit may include three LED chips for generating light of three colors of red, green, and blue (RGB). In this case, it may be that each LED chip emits ultraviolet light, and that a phosphor member for converting the wavelength of ultraviolet light into red, green, or blue light is adhered to each of the three LED chips.

In addition, a form obtained by making various modifications conceivable by those skilled in the art to the embodiments, and a form realized by arbitrarily combining the structural elements and functions in the embodiments without departing from the gist of the present disclosure are also included in the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

A white light emitting device according to the present disclosure is particularly useful in a matrix beam headlamp of an automobile which is required to have different luminance within the plane but to have identical colors.

What is claimed is:

1. A white light emitting device, comprising:
a first light-emitting unit group including a plurality of first light-emitting units to which a first current is applied;
a second light-emitting unit group including a plurality of second light-emitting units to which a second current is applied, the second current being different from the first current; and
a mounting substrate on which the first light-emitting unit group and the second light-emitting unit group are mounted,
wherein each of the plurality of first light-emitting units includes a first light-emitting diode (LED) chip and a first phosphor member, and is arranged adjacent to at least another one of the plurality of first light-emitting units,
each of the plurality of second light-emitting units includes a second LED chip and a second phosphor member, and is arranged adjacent to at least another one of the plurality of second light-emitting units,
when the first current is applied to the plurality of first light-emitting units and the second current is applied to the plurality of second light-emitting units, an average emission chromaticity of the plurality of first light-emitting units and an average emission chromaticity of the plurality of second light-emitting units are identical colors, and
when a same current is applied to both the plurality of first light-emitting units and the plurality of second light-emitting units, the average emission chromaticity of the plurality of first light-emitting units and the average emission chromaticity of the plurality of second light-emitting units are non-identical colors,
wherein, when the average emission chromaticity of the plurality of first light-emitting units at a time of application of the first current to the plurality of first light-emitting units is represented by CIE coordinates (Cx11, Cy11),
the average emission chromaticity of the plurality of second light-emitting units at a time of application of the first current to the plurality of second light-emitting units is represented by CIE coordinates (Cx21, Cy21), and
the average emission chromaticity of the plurality of second light-emitting units at a time of application of the second current to the plurality of second light-emitting units is represented by CIE coordinates (Cx22, Cy22),
the identical colors are defined to satisfy relations of $|Cx11-Cx22| \leq 0.0055$ and $|Cy11-Cy22| < 0.0074$, and
the non-identical colors are defined to satisfy one of relations of $|Cx11-Cx21| \geq 0.0055$ and $|Cy11-Cy21| \geq 0.0074$.

2. The white light emitting device according to claim 1, wherein the first light-emitting unit group and the second light-emitting unit group are arranged adjacent to each other on the mounting substrate.

3. The white light emitting device according to claim 1, wherein when n is a total number of the plurality of first light-emitting units and m is a total number of the plurality of second light-emitting units,
an emission chromaticity of each of the plurality of first light-emitting units at the time of application of the first current to the plurality of first light-emitting units is represented by CIE coordinates (Cx11i, Cy11i) ($1 \leq i \leq n$), and
an emission chromaticity of each of the plurality of second light-emitting units at the time of application of the first current to the plurality of second light-emitting units is represented by CIE coordinates (Cx21i, Cy21i) ($1 \leq i \leq m$),
all of the CIE coordinates (Cx11i, Cy11i) are inside a region represented by $|Cx11-Cx11i| < 0.0055$ and $|Cy11-Cy11i| < 0.0074$, and
all of the CIE coordinates (Cx21i, Cy21i) are inside a region represented by $|Cx21-Cx21i| < 0.0055$ and $|Cy21-Cy21i| < 0.0074$.

4. A white light emitting device, comprising:
a first light-emitting unit group including a plurality of first light-emitting units to which a first current is applied;
a second light-emitting unit group including a plurality of second light-emitting units to which a second current is applied, the second current being different from the first current; and
a mounting substrate on which the first light-emitting unit group and the second light-emitting unit group are mounted,
wherein each of the plurality of first light-emitting units includes a first light-emitting diode (LED) chip and a first phosphor member, and is arranged adjacent to at least another one of the plurality of first light-emitting units,
each of the plurality of second light-emitting units includes a second LED chip and a second phosphor member, and is arranged adjacent to at least another one of the plurality of second light-emitting units,
when the first current is applied to the plurality of first light-emitting units and the second current is applied to the plurality of second light-emitting units, an average emission chromaticity of the plurality of first light-emitting units and an average emission chromaticity of the plurality of second light-emitting units are identical colors, and
when a same current is applied to both the plurality of first light-emitting units and the plurality of second light-emitting units, the average emission chromaticity of the plurality of first light-emitting units and the average emission chromaticity of the plurality of second light-emitting units are non-identical colors,
wherein, when the average emission chromaticity of the plurality of first light-emitting units at a time of application of the first current to the plurality of first light-emitting units is represented by CIE coordinates (Cx11, Cy11),
the average emission chromaticity of the plurality of second light-emitting units at a time of application of the first current to the plurality of second light-emitting units is represented by CIE coordinates (Cx21, Cy21), and
the average emission chromaticity of the plurality of second light-emitting units at a time of application of the second current to the plurality of second light-emitting units is represented by CIE coordinates (Cx22, Cy22),
the identical colors are defined to satisfy that the CIE coordinates (Cx22, Cy22) are inside a 3-step MacAdam ellipse centered around the CIE coordinates (Cx11, Cy11), and the non-identical colors are defined to satisfy that the CIE coordinates (Cx21, Cy21) are either on or outside the 3-step MacAdam ellipse centered around the CIE coordinates (Cx11, Cy11).

5. The white light emitting device according to claim 4, wherein, when an emission chromaticity of each of the plurality of first light-emitting units at the time of application of the first current to the plurality of first light-emitting units is represented by CIE coordinates (Cx11i, Cy11i) (1≤i≤n), and
an emission chromaticity of each of the plurality of second light-emitting units at the time of application of the first current to the plurality of second light-emitting units is represented by CIE coordinates (Cx21i, Cy21i) (1≤i≤m),
all of the CIE coordinates (Cx11i, Cy11i) are inside the 3-step MacAdam ellipse centered around the CIE coordinates (Cx11, Cy11), and
all of the CIE coordinates (Cx21i, Cy21i) are inside a 3-step MacAdam ellipse centered around the CIE coordinates (Cx21, Cy21).

6. A white light emitting device, comprising:
a first light-emitting unit group including a plurality of first light-emitting units to which a first current is applied;
a second light-emitting unit group including a plurality of second light-emitting units to which a second current is applied, the second current being different from the first current; and
a mounting substrate on which the first light-emitting unit group and the second light-emitting unit group are mounted,
wherein each of the plurality of first light-emitting units includes a first light-emitting diode (LED) chip and a first phosphor member, and is arranged adjacent to at least another one of the plurality of first light-emitting units,
each of the plurality of second light-emitting units includes a second LED chip and a second phosphor member, and is arranged adjacent to at least another one of the plurality of second light-emitting units,
when the first current is applied to the plurality of first light-emitting units and the second current is applied to the plurality of second light-emitting units, an average emission chromaticity of the plurality of first light-emitting units and an average emission chromaticity of the plurality of second light-emitting units are identical colors, and
when a same current is applied to both the plurality of first light-emitting units and the plurality of second light-emitting units, the average emission chromaticity of the plurality of first light-emitting units and the average emission chromaticity of the plurality of second light-emitting units are non-identical colors,
wherein, when an average value of chromaticities of all of the first phosphor members included in the first light-emitting unit group is represented by CIE coordinates (CxP1, CyP1), and
an average value of chromaticities of all of the second phosphor members included in the second light-emitting unit group is represented by CIE coordinates (CxP2, CyP2),
relations of 0.0066≤|CxP1−CxP2| and 0.0120≤|CyP1−CyP2| are satisfied.

7. The white light emitting device according to claim 6, wherein the first phosphor members and the second phosphor members are different from each other in at least one of a phosphor species, a phosphor composition, an activated element species in a phosphor, or a concentration of the activated element species in the phosphor.

8. A white light emitting device, comprising:
a first light-emitting unit group including a plurality of first light-emitting units to which a first current is applied;
a second light-emitting unit group including a plurality of second light-emitting units to which a second current is applied, the second current being different from the first current; and
a mounting substrate on which the first light-emitting unit group and the second light-emitting unit group are mounted,
wherein each of the plurality of first light-emitting units includes a first light-emitting diode (LED) chip and a first phosphor member, and is arranged adjacent to at least another one of the plurality of first light-emitting units,
each of the plurality of second light-emitting units includes a second LED chip and a second phosphor member, and is arranged adjacent to at least another one of the plurality of second light-emitting units,
when the first current is applied to the plurality of first light-emitting units and the second current is applied to the plurality of second light-emitting units, an average emission chromaticity of the plurality of first light-emitting units and an average emission chromaticity of the plurality of second light-emitting units are identical colors, and
when a same current is applied to both the plurality of first light-emitting units and the plurality of second light-emitting units, the average emission chromaticity of the plurality of first light-emitting units and the average emission chromaticity of the plurality of second light-emitting units are non-identical colors,
when light with a wavelength equal to a wavelength of one of the first LED chip and the second LED chip is emitted to the first phosphor member and the second phosphor member,
P1 is an average value of emission intensities of all of the first phosphor members included in the first light-emitting unit group, and
P2 is an average value of emission intensities of all of the second phosphor members included in the second light-emitting unit group,
a relation of 0.954≤P2/P1≤0.976 is satisfied.

9. The white light emitting device according to claim 8, wherein the first phosphor members include phosphor particles and the second phosphor members include phosphor particles,
when VP1 is an average value of volumes of all of the first phosphor members included in the first light-emitting unit group, and D1 is an average value of volume concentrations of the phosphor particles of all of the first phosphor members included in the first light-emitting unit group, and
VP2 is an average value of volumes of all of the second phosphor members included in the second light-emitting unit group, and D2 is an average value of volume concentrations of the phosphor particles of all of the second phosphor members included in the second light-emitting unit group,
relations of 0.954≤D2/D1≤0.976 and VP1=VP2 are satisfied.

10. The white light emitting device according to claim 8,
wherein the first phosphor members include phosphor particles and the second phosphor members include phosphor particles,
when VP1 is an average value of volumes of all of the first phosphor members included in the first light-emitting unit group, and D1 is an average value of volume concentrations of the phosphor particles of all of the first phosphor members included in the first light-emitting unit group, and
VP2 is an average value of volumes of all of the second phosphor members included in the second light-emitting unit group, and D2 is an average value of volume concentrations of the phosphor particles of all of the second phosphor members included in the second light-emitting unit group,
relations of $0.954 \leq VP2/VP1 \leq 0.976$ and D1=D2 are satisfied.

11. The white light emitting device according to claim 4, wherein the first light-emitting unit group and the second light-emitting unit group are arranged adjacent to each other on the mounting substrate.

12. The white light emitting device according to claim 6, wherein the first light-emitting unit group and the second light-emitting unit group are arranged adjacent to each other on the mounting substrate.

13. The white light emitting device according to claim 8, wherein the first light-emitting unit group and the second light-emitting unit group are arranged adjacent to each other on the mounting substrate.

* * * * *